(12) United States Patent
Qiu et al.

(10) Patent No.: US 12,230,481 B2
(45) Date of Patent: Feb. 18, 2025

(54) PLASMA REACTOR HAVING ARRAY OF COAXIAL MULTIPLE PINS AND PROCESSING LOW TEMPERATURE PLASMA AT HIGH EFFICIENCY

(71) Applicant: HANGZHOU CITY UNIVERSITY, Hangzhou (CN)

(72) Inventors: Qi Qiu, Hangzhou (CN); Pengfei Wang, Hangzhou (CN); Jiahong Fu, Hangzhou (CN); Xingliang Liu, Hangzhou (CN); Zhaozhe Deng, Hangzhou (CN)

(73) Assignee: HANGZHOU CITY UNIVERSITY, Hangzhou (CN)

( * ) Notice: Subject to any disclaimer, the term of this patent is extended or adjusted under 35 U.S.C. 154(b) by 109 days.

(21) Appl. No.: 18/167,897

(22) Filed: Feb. 13, 2023

(65) Prior Publication Data
US 2024/0006162 A1     Jan. 4, 2024

(30) Foreign Application Priority Data

Jun. 29, 2022   (CN) .......................... 202210747101.X

(51) Int. Cl.
*H01J 37/32*     (2006.01)
*G01R 1/04*      (2006.01)

(52) U.S. Cl.
CPC ...... *H01J 37/32458* (2013.01); *G01R 1/0458* (2013.01); *H01J 37/32568* (2013.01);
(Continued)

(58) Field of Classification Search
CPC .. H01J 37/32; H01J 37/32348; H01J 37/3244; H01J 37/32458; H01J 37/32449; H01J 37/32743; H01J 37/32642; H01J 37/32935; H01J 37/32568; H01J 37/32899; H05H 1/2431; H05H 1/2418; H05H 1/2439
See application file for complete search history.

(56) References Cited

U.S. PATENT DOCUMENTS

| | | | |
|---|---|---|---|
| 11,968,769 B1* | 4/2024 | Qiu | ...................... H05H 1/2406 |
| 2004/0182314 A1* | 9/2004 | Rosocha | ........... H01J 37/32009 118/715 |

(Continued)

FOREIGN PATENT DOCUMENTS

| | | |
|---|---|---|
| AU | 2019394363 A1 | 7/2021 |
| CN | 101229484 A | 7/2008 |

(Continued)

*Primary Examiner* — Thai Pham

(57) ABSTRACT

A plasma reactor, configured to process low temperature plasma, includes: a rotating reactor, a fixed reactor, and a master tube. An end of the master tube is connected to two branched tubes, one of the two branched tubes is connected to the rotating reactor, and the other one of the two branched tubes is connected to the fixed reactor. When a flow rate of inlet gas is less than a threshold defined by a flow detector, all the gas enters the rotating reactor from one of the two branched tubes. When the flow rate of the inlet gas is greater than the threshold of the flow detector, a valve is configured to operate to allow a part of the inlet gas that exceeds the threshold to enter the fixed reactor from the other one of the two branched tubes.

10 Claims, 13 Drawing Sheets

(52) U.S. Cl.
 CPC .. *H01J 37/32642* (2013.01); *H01J 37/32743* (2013.01); *H01J 37/32899* (2013.01); *H01J 37/32935* (2013.01)

(56) References Cited

U.S. PATENT DOCUMENTS

2012/0285146 A1* 11/2012 Ikeda ........................ F01N 3/01
 60/275
2016/0236933 A1* 8/2016 Murata ................ C01B 13/115

FOREIGN PATENT DOCUMENTS

| CN | 204107662 U | 1/2015 |
| CN | 205093031 U | 3/2016 |
| CN | 107288726 A | 10/2017 |
| CN | 208466180 U | 2/2019 |
| CN | 208771160 U | 4/2019 |
| CN | 208911843 U | 5/2019 |
| CN | 112076597 A | 12/2020 |
| CN | 213255101 U | 5/2021 |
| CN | 113426579 A | 9/2021 |

* cited by examiner

PLASMA REACTOR HAVING ARRAY OF COAXIAL MULTIPLE PINS AND PROCESSING LOW TEMPERATURE PLASMA AT HIGH EFFICIENCY

CROSS REFERENCE TO RELATED APPLICATIONS

The present application claims the priority of Chinese patent application No. 202210747101.X, filed on Jun. 29, 2022, and the contents of which are incorporated herein by their entireties.

TECHNICAL FIELD

The present disclosure relates to the field of dielectric barrier discharging (DBD), and in particular to a reactor that has an array of coaxial multiple pins and processes low temperature plasma at a high efficiency.

BACKGROUND

Dielectric barrier discharging (DBD) is a non-equilibrium gas discharging where an insulating medium is inserted into a discharging space. The DBD may also be referred to as dielectric barrier corona discharging. Applying the dielectric barrier discharging to generate low temperature plasma is a new type of post-emission treatment. The treatment has low cost, consumes low energy and is highly efficient, and may be applied for treating industrial and civil waste gas.

A DBD reactor in the art may include a tubular electrode structure and a flat electrode structure. While the tubular electrode structured DBD reactor is processing high concentration of gases, in order to improve a treatment effect, an inner electrode and a discharging pin may rotate to generate turbulent airflow, such that a treatment area may be expanded, and a treatment effect that the discharging pin performs on the gases may be improved. However, when the flow rate of the gas is excessively high, two problems may be caused. On one hand, when the flow rate of the gas of a rotating reactor is excessively high, the inner electrode rotates excessively fast, which may cause danger. On the other hand, an airflow inside a reactor tube may be turbulent, and the reactor tube may be congested, such that the airflow may not fluently flow along the reactor tube, and an internal structure of the reactor tube may be damaged.

Compared to the rotating reactor, a reactor that has fixed discharging pins may allow the airflow to pass through fluently. However, the discharging pins are stationary, a range of the gases that can be treated may be smaller. Some of the gases may not be concentrated and flow through a discharging area at a tip of the pin, and therefore, the treatment of the gases may be less effective. Therefore, when the gases to be treated are flowing sometimes fast and sometimes slowly, the present application aims to provide a plasma reactor for optimally treating the gases based on airflow variations.

SUMMARY OF THE DISCLOSURE

The present disclosure provides a plasma reactor that has an array of coaxial multiple pins and processes low temperature plasma at a high efficiency. According to the present disclosure, gases may be separated to flow to a rotating reactor and a fixed reactor respectively based on the flow rate of the gas to be treated, such that a more optimized gas treatment solution may be achieved.

According to the present disclosure, a plasma reactor that has an array of coaxial multiple pins and processes low temperature plasma at a high efficiency, includes: a master tube. An end of the master tube is connected to two branched tubes, an end of one of the two branched tubes is connected to the rotating reactor, and an end of the other one of the two branched tubes is connected to the fixed reactor. The master tube is arranged with a flow detector, and an electric three-way ball valve is arranged at connection between the master tube and the two branched tubes. When a flow rate of inlet gas entering the master tube is less than a preset threshold defined by the flow detector, all the inlet gas enters the rotating reactor from the branched tube connected to the rotating reactor and is processed by the rotating reactor. When the flow rate of the inlet gas entering the master tube is greater than the preset threshold of the flow detector, the electric three-way ball valve is configured to operate to allow a part of the inlet gas that exceeds the preset threshold to enter the fixed reactor from the branched tube connected to the fixed reactor and to be processed by the fixed reactor. A rotating blade is arranged on an inner electrode of the rotating reactor, when the flow rate of the inlet gas reaches a certain value, the inlet gas is configured to generate sufficient thrust on fan blades of the rotating blade to drive the rotating blade to rotate, a plurality of discharging pins arranged on a surface of the inner electrode of the rotating reactor are driven to rotate, a discharging treatment area of the discharging pins is expanded. An inner electrode of the fixed reactor is fixedly arranged, a front guide ring is arranged in front of a plurality of discharging pins of the inner electrode of the fixed reactor, the front guide ring radially defines a plurality of grooves, the plurality of grooves are aligned with the plurality of discharging pins.

In some embodiments, the rotating reactor includes a first frame, a first flow guide cover is arranged on each of two sides of the first frame, a plurality of first reaction units are arranged inside the first frame; the first reaction unit comprises a first reaction tube, a first inner electrode is arranged inside the first reaction tube. The first inner electrode is arranged with a plurality of first discharging pins, the rotating blade is arranged on the first inner electrode. When the inlet gas passes through fan blades of the rotating blade, the inlet gas flows along surfaces of the fan blades of the rotating blade.

In some embodiments, the fixed reactor comprises a second frame, a baffle is arranged on each of two sides of the second frame and each of two sides of the first frame, the baffle is arranged with a low pressure connector, each of two sides of the second frame is arranged with a second flow guide cover; a plurality of second reaction units are arranged inside the second frame, each of the plurality of second reaction units comprises a second reaction tube connected to the second flow guide cover, a second inner electrode is arranged inside the second reaction tube; a surface of the second inner electrode is arranged with a plurality of second discharging pins, the front guide ring is arranged on the second inner electrode and is disposed at front of a corresponding one of the plurality of second discharging pins; a surface of the front guide ring is arranged with a convex surface, facing towards a gas inlet end of the fixed reactor. After the inlet gas enters the second reaction tube, the inlet gas contacts the convex surface of the front guide ring and flows into the plurality of grooves, the inlet gas spreads towards all directions along the plurality of grooves, and the inlet gas that flows along the plurality of grooves is concentrated and flows towards the corresponding second discharging pin.

In some embodiments, wherein the first inner electrode is arranged with a flow guide ring, the flow guide ring is disposed at a front of a corresponding one of the plurality of first discharging pins; a side of the flow guide ring facing the gas inlet end of the rotating reactor is arranged with a flow guide surface; after the inlet gas contacts the flow guide ring, the inlet gas spreads outwards along the flow guide surface of the flow guide ring, a proportion of the inlet gas passing through tips of the first discharging pins is increased.

In some embodiments, the first inner electrode is arranged with a rear guide ring, the rear guide ring is disposed at a rear of a corresponding one of the plurality of first discharging pins; a surface of the rear guide ring is arranged with a concave surface, facing the gas inlet end of the rotating reactor. After the inlet gas passes through the discharging area of the first discharging pins, the inlet gas contacts the rear guide ring and flows in return along the concave surface of the rear guide ring to form returning gas, the returning gas again passes through the discharging area of the first discharging pins and is again treated by the first discharging pins. The returning gas and the inlet gas that flows forwardly form an axial vortex in the discharging area of the discharging pins, a time length that the gas stays in the discharging area of the first discharging pins is extended. Rotation of the first discharging pins drives the returning gas and the inlet gas and the high-energy electrons and ions to rotate to generate a radial airflow vortex, the radial airflow vortex is mixed with the axial vortex.

In some embodiments, each of the first inner electrode and the second inner electrode is arranged with a spoiled fan; when the inlet gas passes through the spoiled fan, the inlet gas flows along fan blades of the spoiled fan, a flowing direction of the inlet gas is changed.

In some embodiments, the front guide ring comprises an upper part and a lower part, an end face of the upper part is arranged with a block, and an end face of the lower part defines a socket for receiving the block, and the block is capable of being engaged into the socket.

In some embodiments, each of the first reaction tube and the second reaction tube comprises a quartz tube and a stainless steel mesh sleeved by the quartz tube; a part of the quartz tube and a corresponding part of the stainless steel mesh cooperatively form a high pressure pole area; a connection ring is arranged at a middle of the stainless steel mesh, and adjacent connection rings are connected to each other.

In some embodiments, the baffle is arranged with a plurality of end caps, each of the plurality of first reaction units and each of the plurality of second reaction units are disposed between two corresponding ones of the plurality of end caps; each of the end caps defines a mounting slot, two ends of the second reaction tube extend into two corresponding mounting slots; a sealing ring is received in the mounting slot; each of the plurality of end caps defines a fixing hole to fix the second inner electrode and defines a through hole to intake or output the inlet gas.

In some embodiments, each of the first inner electrode and the second inner electrode is arranged with a plurality of fixing sleeves, and a set of first discharging pins and a set of second discharging pins are arranged on the fixing sleeves correspondingly.

According to the present disclosure, following effects may be achieved.

1. When the flow rate of the inlet gas entering the master tube is less than a preset threshold of a flow rate detector, all the gas enters the rotating reactor from the branched tube and is treated by the rotating reactor, such that an optimized treatment for the inlet gas in this situation may be achieved. When the flow rate of the inlet gas entering the master tube is greater than the preset threshold of the flow detector, the electric three-way ball valve operates to allow a part of the gas that exceeds the preset threshold to enter the fixed reactor from another branched tube and to be treated by the fixed reactor. In this way, the flow rate of the gas of the rotating reactor may not be excessively high, and the inner electrode may not rotate excessively fast, and dangerous situations may be avoided. The fixed reactor may operate cooperatively to allow the gas to flow more fluently. The reactor of the present disclosure may be suitable for optimally distributing the gases to be treated when the gasses to be treated is flowing at a large flow rate.

2. In detail, the reactor of the present disclosure is arranged with a maser tube. An end of the master tube is connected to two branched tubes. One of the two branched tubes is connected to the rotating reactor, and the other one of the two branched tubes is connected to the fixed reactor. The master tube is configured with a flow detector and an electromagnetic valve. When the flow rate of the inlet gas entering the master tube is less than the preset threshold of the flow detector, all the gas enters the rotating reactor through the branched tube connected to the rotating reactor and is treated by the rotating reactor. When the flow rate of the inlet gas entering the master tube is greater than the preset threshold of the flow detector, the electromagnetic valve operates, allowing a part of the gas that exceeds the preset threshold to enter the fixed reactor through the branched tube connected to the fixed reactor and is processed by the fixed reactor. In this way, the flow rate of the inlet gas of the rotating reactor may not be excessively high, the inner electrode may not rotate excessively fast, dangerous situations may not occur, and the gas may flow more fluently. Further, the second inner electrode of the fixed reactor is configured with a front guide ring, and a surface of the front guide ring is arranged with a convex surface facing the gas inlet end of the fixed reactor. The convex surface of the guide ring defines a plurality of grooves, aligning with the plurality of discharging pins. Side walls of the grooves are curved. The inlet gas enters the second reaction tube, contacts the convex surface of the front guide ring, flows into the grooves along the curved surface, and further flows spreadly towards various directions along the grooves. The inlet gas flowing along the grooves is concentrated towards the corresponding second discharging pin. On one hand, the gas may flow through the discharging area of the tip of the second discharging pin, the purification effect on the gas in the discharging area of the discharging tip may be improved. On the other hand, the gas may be more concentrated, flowing towards the area where the second discharging pins is located, such that a proportion of the gas flowing through the discharging area of the second discharging pin may be increased. Therefore, according to the present disclosure, gases to be treated may be distributed to the rotating reactor and the fixed reactor based on the flow rate of the gas to be treated, such that a more optimized gas treatment solution may be achieved.

3. According to the present disclosure, the first inner electrode is configured with a flow guide ring. The flow guide ring is arranged in a front of the corresponding first discharging pin. The side of the flow guide ring facing the gas inlet end of the rotating reactor is arranged with a flow guide surface. When the inlet gas contacts the flow guide ring, the inlet gas may spread outwards along the flow guide surface of the flow guide ring, the proportion of the inlet gas passing through the tip of the first discharging pin may be increased, and the treatment effect on the gas applied by the first discharging pin may be improved.

4. According to the present disclosure, the first inner electrode is configured with a rear guide ring. The surface of the rear guide ring is arranged with a concave surface, facing the gas inlet end of the reactor. After the inlet gas passes through the discharging area of the discharging pin, the inlet gas contacts the rear guide ring and flows in return along the concave surface of the rear guide ring to form returning gas. The returning gas passes through the discharging area of the discharging pin again and is treated by the discharging pin again. At the same time, the returning gas and the inlet gas flowing forwardly form a vortex in the discharging area of the discharging pin. In this way, a time length that the gas stays at the discharging area of the discharging pin may be extended, and the purification effect on the gas applied by the discharging pin may be improved.

5. According to the present disclosure, each of the first inner electrode and the second inner electrode is configured with a spoiler fan. When the gas passes through the spoiler fan, the gas flows along fan blades of the spoiler fan, such that a flowing direction of the gas may be changed, the airflow flowing through the spoiler fan may be more turbulent, and the treatment effect on the gas may be improved.

6. According to the present disclosure, the front guide ring includes an upper part and a lower part. An end face of the upper part is arranged with a block, and an end face of the lower part defines a socket capable of receiving the block. The block may be engaged with the socket, enabling the front guide ring to be assembled or detached.

Figure 1:
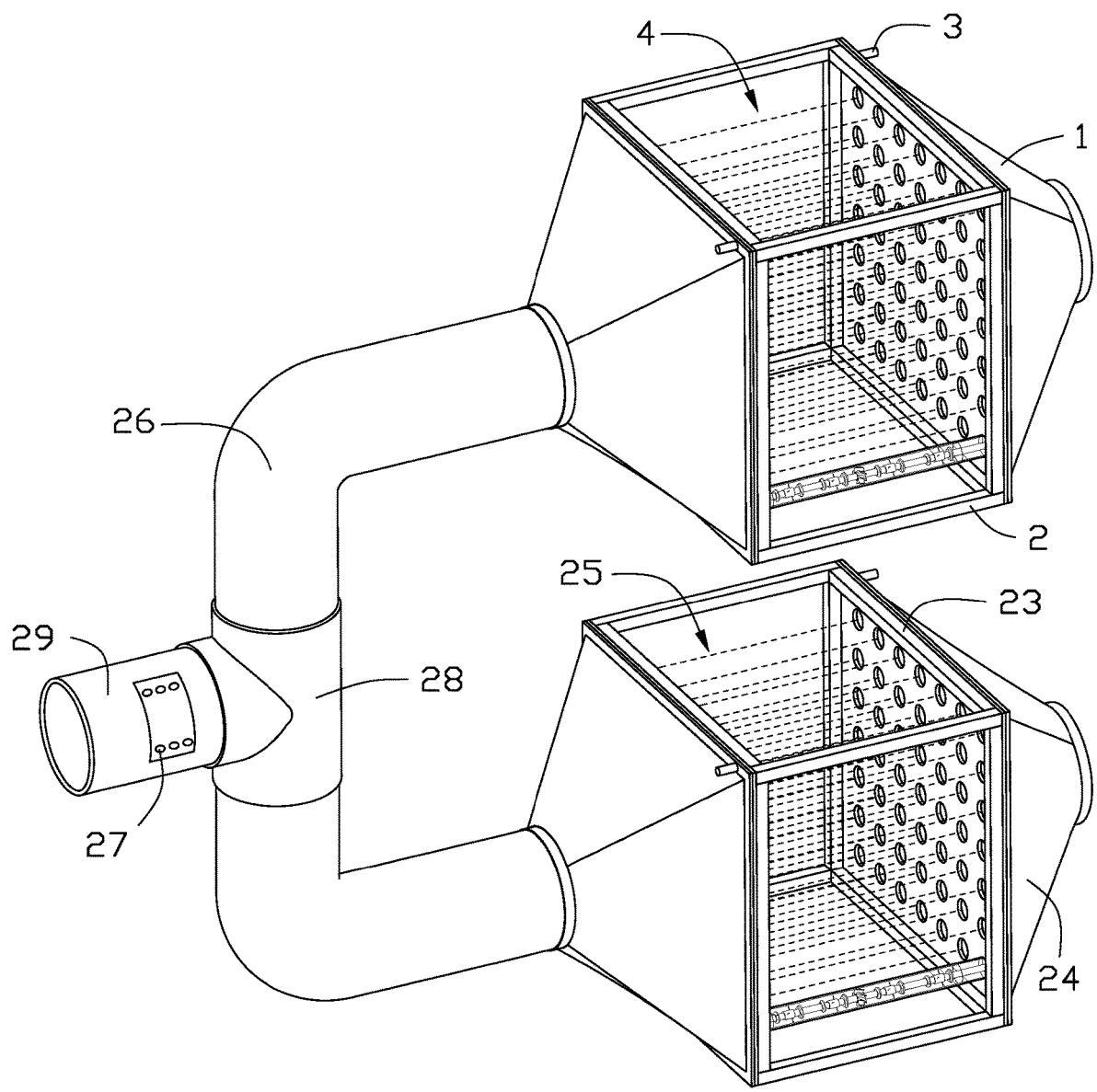
FIG. 1 is a structural schematic view of a plasma reactor of the present disclosure.
Figure 2:
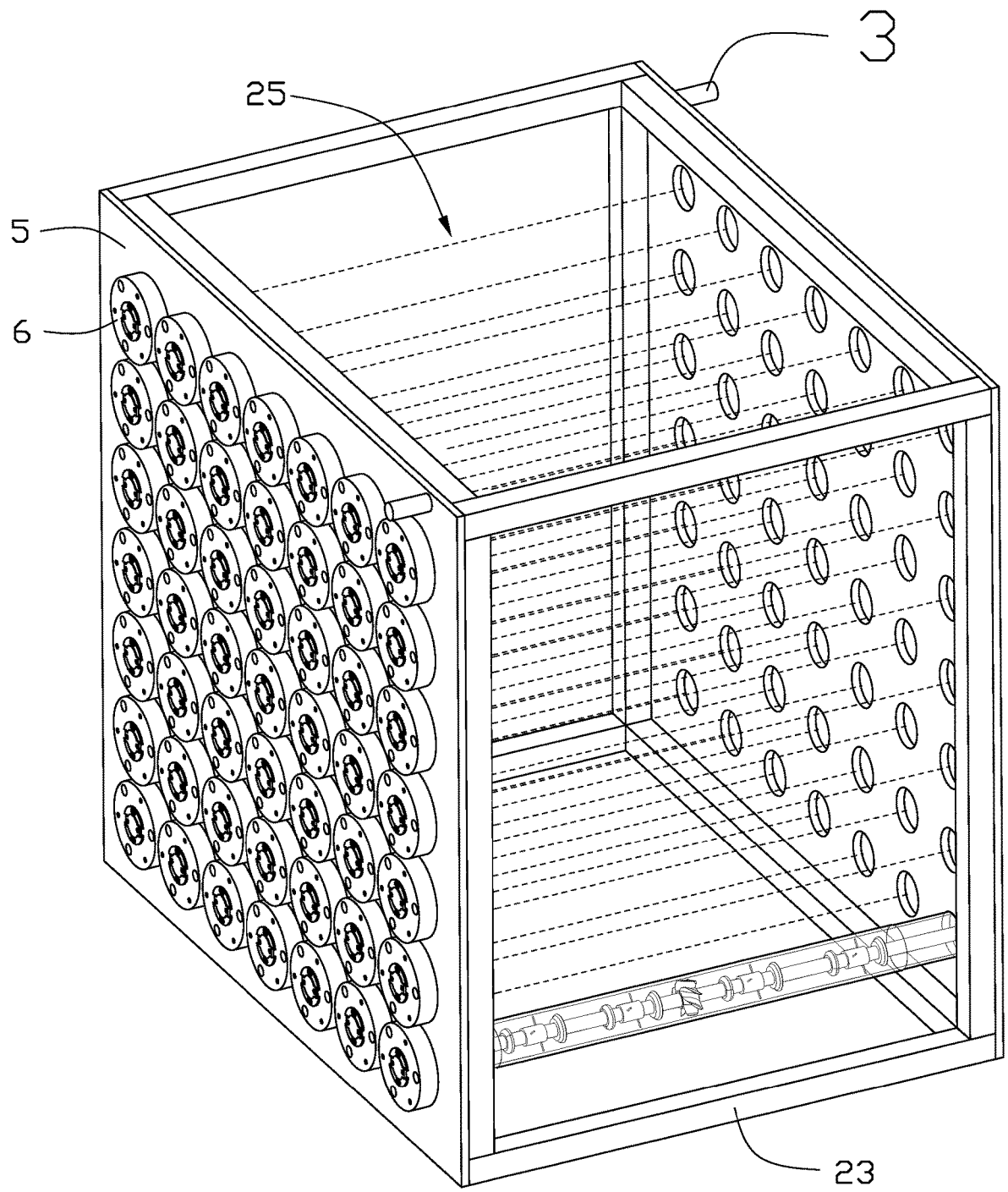
FIG. 2 is a structural schematic view of a rotating reactor according to an embodiment of the present disclosure.
Figure 2A:
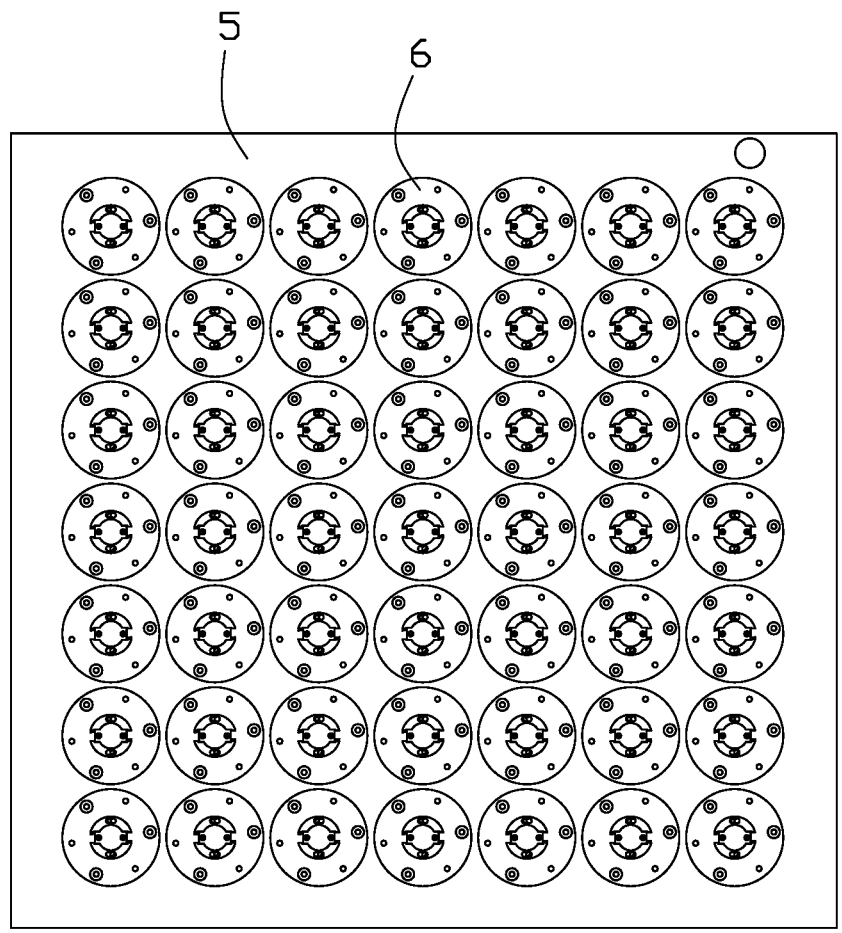
FIG. 2A is a front view of the rotating reactor shown in FIG. 2, viewing from a surface of the rotating reactor near a mater tube of the plasma reactor.
Figure 2B:
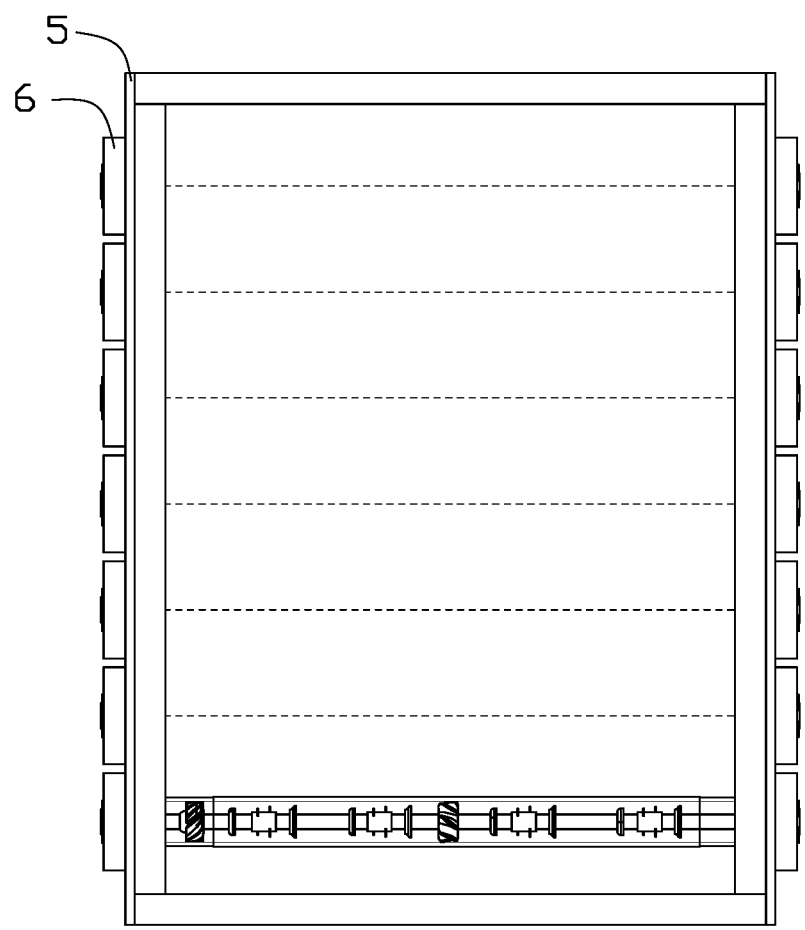
FIG. 2B is a side view of the rotating reactor shown in FIG. 2, viewing from a side connected to the surface of the rotating reactor near the mater tube of the plasma reactor.
Figure 2C:
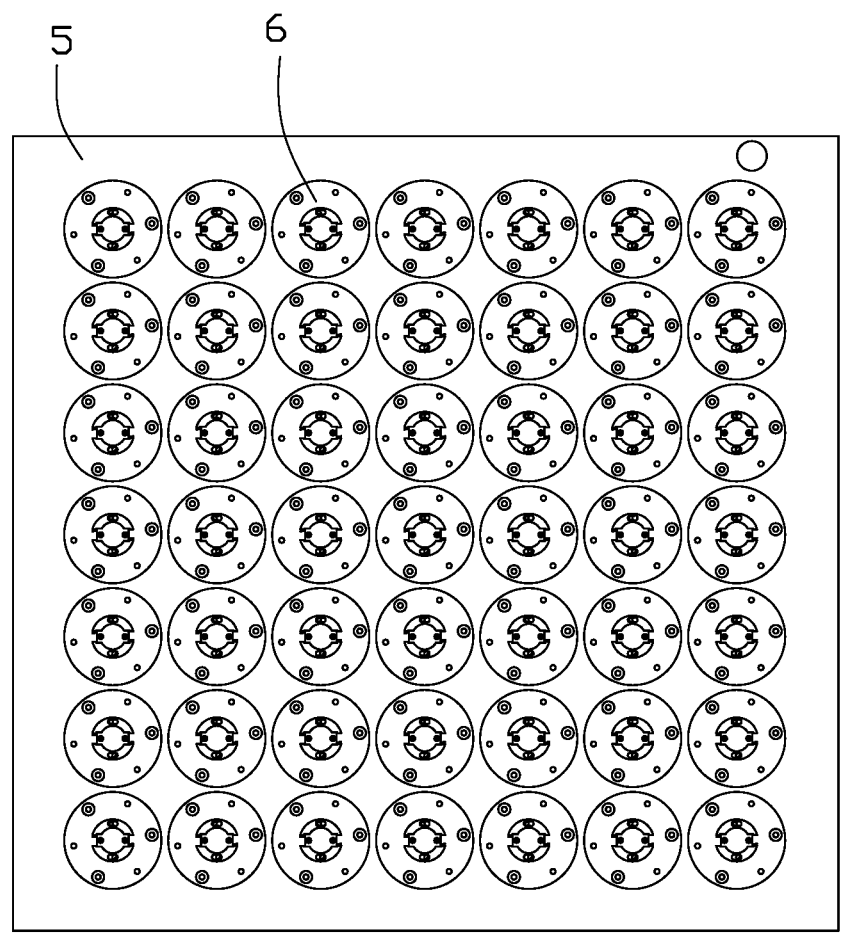
FIG. 2C is a rear view of the rotating reactor shown in FIG. 2, viewing from a surface of the rotating reactor away from the mater tube of the plasma reactor.

Reference numerals in the drawings: 1—second flow guide cover; 2—second frame; 3—low pressure connector; 4—second reaction unit; 5—baffle; 6—end cap; 7—quartz tube; 8—front guide ring; 801—upper part; 802—lower part; 803—convex surface; 9—rear guide ring; 901—concave surface; 10—stainless steel mesh; 11—fixing sleeve; 12—second discharging pin; 13—spoiler fan; 14—connection ring; 15—second inner electrode; 16—groove; 17—block; 18—socket; 19—mounting slot; 20—seal ring; 21—fixing hole; 22—through hole; 23—first frame; 24—first flow guide cover; 25—first reaction unit; 26—branched tube; 27—flow detector; 28—electric three-way ball valve; 29—master tube; 30—first inner electrode; 31—rotating fan blade; 32—flow guide ring; 33—first discharging pin.

DETAILED DESCRIPTION

The present disclosure is to be further described below by referring to the accompanying drawings and embodiments, but the drawings and the embodiments does not limit the scope of the present disclosure.

Figure 3:
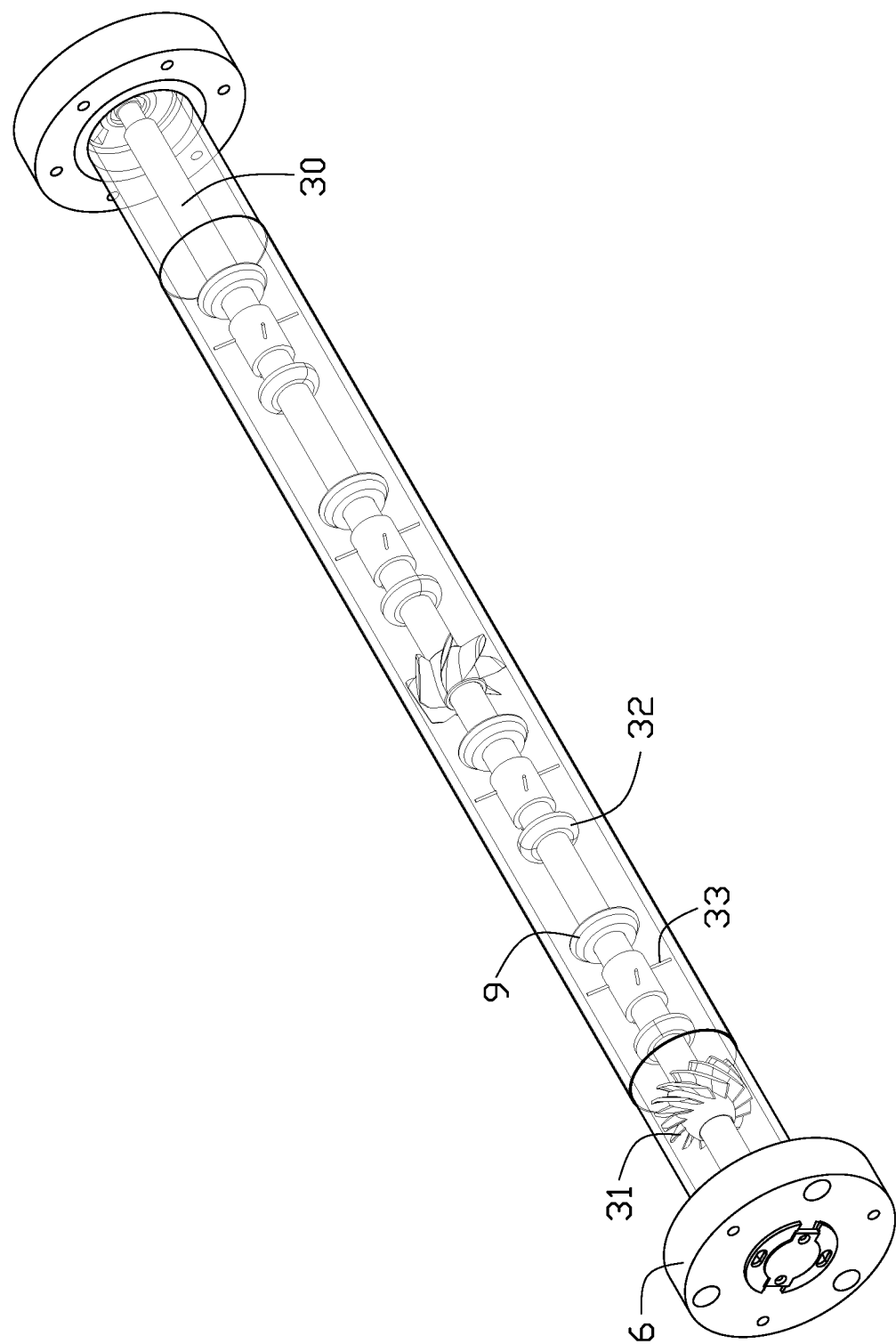
FIG. 3 is a structural schematic view of a first reactor unit according to an embodiment of the present disclosure.

In an embodiment, the plasma reactor that has a plurality of pins arranged in an array and coaxially and processes temperature plasma at a high efficiency is provided and shown in FIG. 1. The plasma reactor includes a master tube 29. An end of the master tube 29 is connected to two branched tubes 26. One of the two branched tubes 26 is connected to a rotating reactor, and the other one of the two branched tubes 26 is connected to a fixed reactor. The master tube 29 is configured with a flow detector 27. An electric three-way ball valve 28 is arranged at the connection between the master tube 29 and the branched tubes 26. The flow detector 27 and the electric three-way ball valve 28 are connected to an external control circuit. When the flow rate of the inlet gas entering the master tube 29 is less than a preset threshold defined by the flow detector 27, all the inlet gas enters the rotating reactor from the branched tube 26 connected to the rotating reactor and is processed by the rotating reactor. When the flow rate of the inlet gas entering the master tube 29 is greater than the preset threshold of the flow detector 27, the electric three-way ball valve 28 operates to allow a part of the gas that exceeds the preset threshold to enter the fixed reactor from the branched tube 26 connected to the fixed reactor and to be processed by the fixed reactor. In this way, the flow rate of the gas of the rotating reactor may not be excessively large, an inner electrode may not rotate excessively fast, and dangerous situations may be avoided, and the gas may flow more fluently. Detailed structure of the reactor is shown in FIG. 3 and will be described later.

A rotating blade 31 is arranged on the inner electrode of the rotating reactor. When the flow rate of the inlet gas reaches a certain value, the inlet gas generates sufficient thrust on fan blades of the rotating blade 31 to drive the rotating blade 31 to rotate. In this way, the discharging pin on the surface of the inner electrode of the rotating reactor may be driven to rotate, a discharging treatment area of the discharging pin may be expanded, mixing of the treated gas and high-energy electrons and ions in the discharging area may be improved, and the treatment effect on the gas applied by the discharging pin may be improved.

The inner electrode of the fixed reactor is fixed. A front guide ring 8 is arranged at a front of the discharging pin of the inner electrode of the fixed reactor. The front guide ring 8 radially defines a plurality of grooves 16. Each of the grooves 16 is aligned with the discharging pin 12, the purification treatment on the gas may be improved, and the gas may flow more fluently.

According to the present disclosure, when the flow rate of the inlet gas entering the master tube is less than the preset threshold of the flow detector, all the gas enters the rotating reactor through one of the two branched tubes and is treated by the rotating reactor, such that an optimized treatment may be applied to the gas in this situation. When the flow rate of the inlet gas entering the master tube is greater than the preset threshold of the flow detector, the electric three-way ball valve operates, allowing the part of the gas that exceeds the preset threshold to enter the fixed reactor through the other one of the two branched tubes and is processed by the fixed reactor. In this way, the flow rate of the gas of the rotating reactor may not be excessively high, the inner electrode may not rotate excessively fast, dangerous situations may not occur. The fixed reactor may operate cooperatively with the rotating reactor, such that the gas may flow more fluently. The cooperation of the fixed reactor and the rotating reactor may be suitable for optimally distributing the gas when the gas to be treated is flowing at a large flow rate. For example, only 2 reactors may be placed in a certain unit area. The rotating reactor may be able to treat gas having a gas flow rate of a $m^3/min$, and the fixed reactor may be able to treat gas having a gas flow rate of 2a $m^3/min$. According to the present disclosure, gas having a maximum gas flow rate of 3a $m^3/min$ may be treated. When the gas flow rate is less than a $m^3/min$, the gas may be treated entirely by the rotating reactor. When the gas to be treated has a flow rate exceeding a $m^3/min$, the gas of a $m^3/min$ may enter the rotating reactor, and a high-quality purification treatment may be performed on the gas by the rotating reactor, and the remaining gas may enter the fixed reactor, and a general treatment may be performed on the gas. When the two reactors are both rotating reactors, the gas that can be treated may have a maximum gas flow rate of 2a $m^3/min$; that is, an upper limit of the gas flow rate may be low. The two reactors may not be applied in a situation where the flow rate of the gas to be treated varies drastically from time to time.

As shown in FIG. 2, FIG. 2A, FIG. 2B, and FIG. 2C, the rotating reactor includes a first frame 23. A first flow guide cover 24 is arranged on each of two sides of the first frame 23. A plurality of first reaction units 25 are arranged inside the first frame 23. As shown in FIG. 3, the first reaction unit includes a first reaction tube. The first reaction tube is arranged with a first inner electrode 30 capable of rotating, and the first inner electrode 30 is arranged with a plurality of first discharging pins 33. The rotating blade 31 is arranged on the first inner electrode 30. When the inlet gas passes through the fan blades of the rotating blade 31, the gas flows along surfaces of the fan blades of the rotating blade 31, such that the laminar-flowing gas flows turbulently, an effect of disturbing the gas may be achieved, the gas may be mixed more sufficiently, and the treatment on the gas may be improved.

Figure 4:
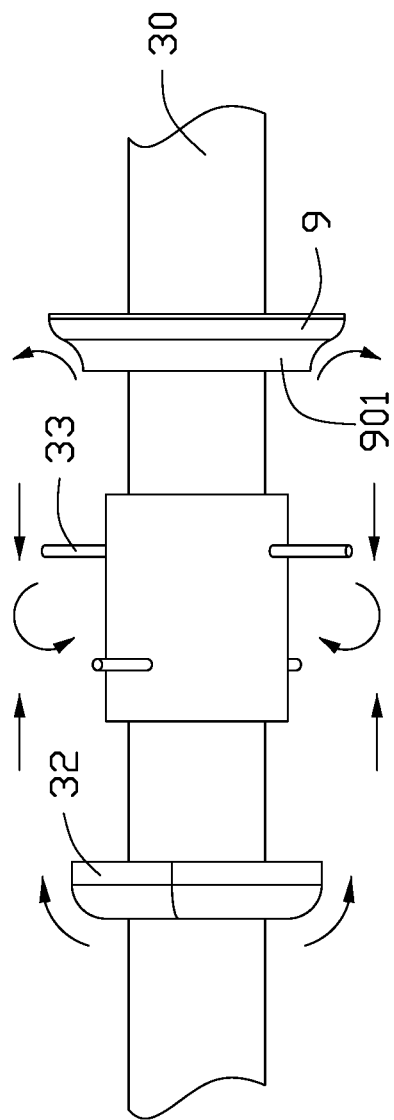
FIG. 4 is a structural schematic view of a flowing direction of gas in a first reactor tube according to an embodiment of the present disclosure.

As shown in FIG. 4, the first inner electrode 30 is arranged with a flow guide ring 32. The flow guide ring 32 is disposed at a front of a corresponding first discharging pin 33. A side of the flow guide ring 32 facing a gas inlet end of the rotating reactor is arranged with a flow guide surface. After the inlet gas contacts the flow guide ring 32, the inlet gas may spread outwards along the flow guide surface of the flow guide ring 32. A proportion of the inlet gas passing through a tip of the first discharging pin 33 may be increased, and the treatment effect on the gas applied by the first discharging pin 33 may be improved.

The first inner electrode 30 is also arranged with a rear guide ring 9. The rear guide ring 9 is disposed at a rear of a corresponding first discharging pin 33. A surface of the rear guide ring 9 is arranged with a concave surface 901, facing the gas inlet end of the rotating reactor. After the inlet gas passes through the discharging area of the first discharging pin 33, the inlet gas contacts the rear guide ring 9 and flows in return along the concave surface 901 of the rear guide ring 9 to form returning gas. The returning gas again passes through the discharging area of the first discharging pin 33 and is again treated by the first discharging pin 33. At the same time, the returning gas and the inlet gas that flows forwardly form an axial vortex in the discharging area of the discharging pin 12. A time length that the gas stays in the discharging area of the first discharging pin 33 may be extended. At the same time, rotation of the first discharging pin 33 may drive the returning gas and the inlet gas and the high-energy electrons and ions to rotate to generate a radial airflow vortex. The radial airflow vortex may be mixed with the axial vortex, such that a mixing time length and contact between the high-energy electrons and ions and the treated gas may further be increased, and the purification effect on the gas applied by the first discharging pin 33 may be improved.

Figure 5:
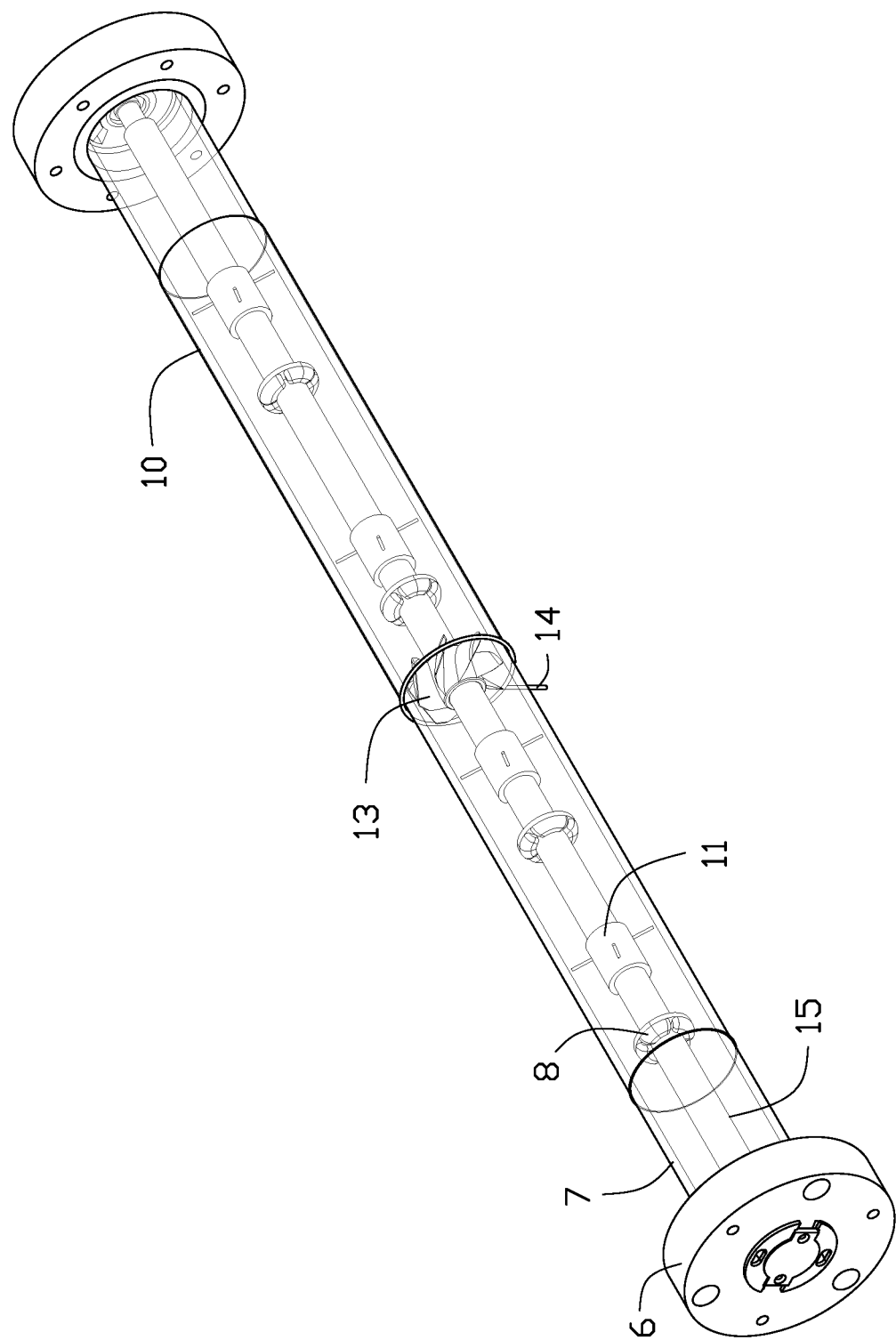
FIG. 5 is a structural schematic view of a fixed reaction tube according to an embodiment of the present disclosure.
Figure 6:
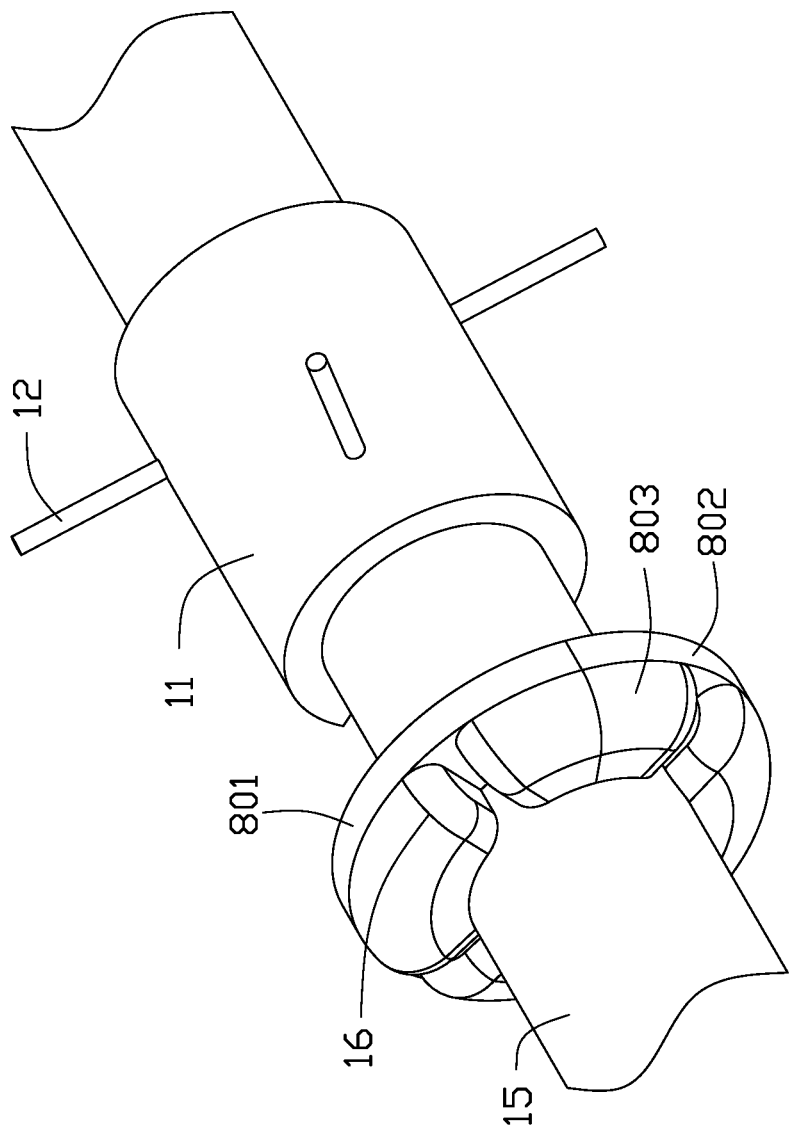
FIG. 6 is a structural schematic view of a front guide ring assembled with a second inner electrode according to an embodiment of the present disclosure.
Figure 10:
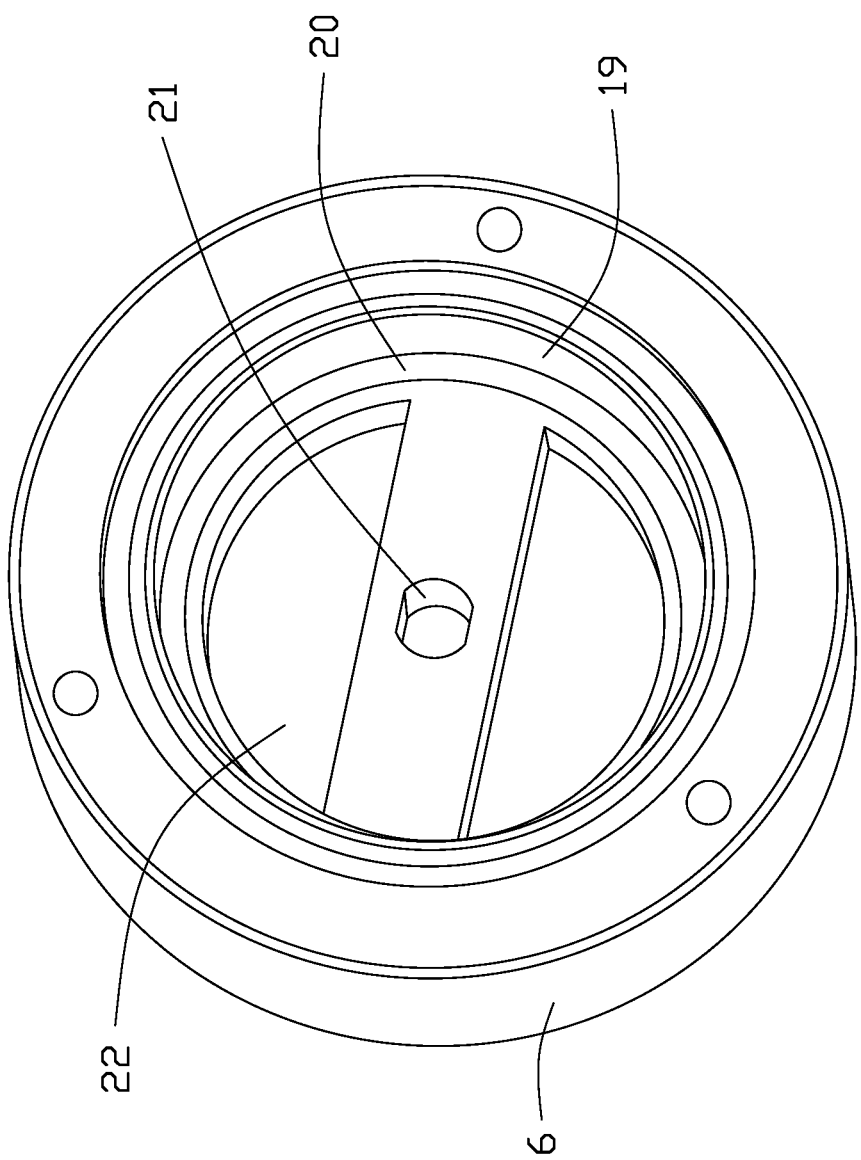
FIG. 10 is a structural schematic view of an end cover according to an embodiment of the present disclosure.

As shown in FIG. 5 and FIG. 6, a fixed reaction tube is shown. In some embodiments, a plurality of fixed reaction tubes may be arranged in a second frame 2 (such as second frame 2 shown in FIG. 1 and FIG. 2) to form the fixed reactor. A baffle 5 is arranged on each of two sides of the second frame 2 and each of the two sides of the first frame 23. The baffle 5 is arranged with a low pressure connector 3. The baffle 5 is arranged with a plurality of end caps 6. Each first reaction unit 25 and each second reaction unit 4 are disposed between two corresponding end caps 6. As shown in the FIG. 10, the end cap 6 defines a mounting slot 19. Two ends of the second reaction tube extend into corresponding mounting slots 19. A sealing ring 20 is received in the mounting slots 19. The sealing ring 20 may prevent the gas from leaking from the connection of the end caps 6. The end cap 6 may further define a fixing hole 21 for fixing the second inner electrode 15 and a through hole 22 for intaking or outputting the gas.

Each of two sides of the second frame 2 is arranged with a second flow guide cover 1. A plurality of second reaction units 4 are arranged inside the second frame 2. As shown in FIG. 5, the second reaction unit 4 and the first reaction unit 25 are distributed in a matrix. The second reaction unit 4 includes a second reaction tube connected to the second guide cover 1. Each of the first reaction tube and the second reaction tube includes a quartz tube 7 and a stainless steel mesh 10 sleeved by the quartz tube 7. A part of the quartz tube 7 and a corresponding part of the stainless steel mesh 10 cooperatively form a high pressure pole area. A connection ring 14 is arranged in a middle of the stainless steel mesh 10. Adjacent connection rings 14 are connected to each other.

A second inner electrode 15 is arranged inside the second reaction tube. A surface of the second inner electrode 15 is arranged with a plurality of second discharging pins 12. Each of the first inner electrode 30 and the second inner electrode 15 are arranged with a plurality of fixing sleeves 11. Each set of first discharging pins 33 and each set of second discharging pins 12 are arranged on corresponding fixing sleeves 11.

Figure 7:
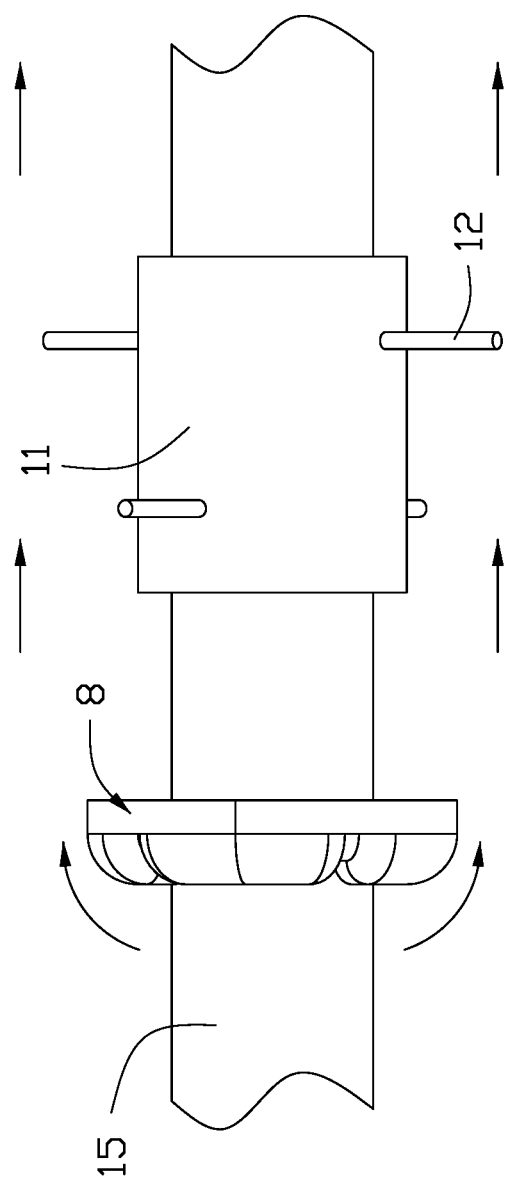
FIG. 7 is a structural schematic view of a flowing direction of gas in a second reactor tube according to an embodiment of the present disclosure.

As shown in FIG. 6, the front guide ring 8 is arranged on the second inner electrode 15. Each front guide ring 8 is disposed in a front of a corresponding second discharging pin 12. A surface of the guide ring 8 is arranged with a convex surface 803 facing the gas inlet end of the fixed reactor. The convex surface 803 of the guide ring 8 defines a plurality of grooves 16. The plurality of grooves 16 is aligned with a plurality of second discharging pins 12. Side walls of the grooves 16 are curved. As shown in FIG. 7, after the inlet gas enters the second reaction tube, the inlet gas contacts the convex surface 803 of the front guide ring 8 and flows into the grooves 16 along the curved surface. Further, the inlet gas spreads towards various directions along the grooves 16. The inlet gas that flows along the grooves 16 may be concentrated towards the corresponding second discharging pin 12. On one hand, the gas may flow through the discharging area of the tip of the second discharging pin 12. Since the tip of the second discharging pin 12 may be an area having the high-energy electrons and ions, the purification effect on the gas applied by the discharging area of the tip of the second discharging pin 12 may be improved by allowing the gas to flow through the tip of the second discharging pin 12. On the other hand, the gas may be concentrated and flow towards the region where the second discharging pin 12 is arranged, and the proportion of gas flowing through the discharging are of the second discharging pin 12 may be increased.

Each of the first inner electrode 30 and the second inner electrode 15 is arranged with a spoiled fan 13. When the inlet gas passes through the spoiled fan 13, the inlet gas may flow along fan blades of the spoiled fan 13, such that the flowing direction of the inlet gas may be changed. The gas that flows through the spoiled fan 13 may be more turbulent, and the treatment effect on the gas may be improved.

Figure 8:
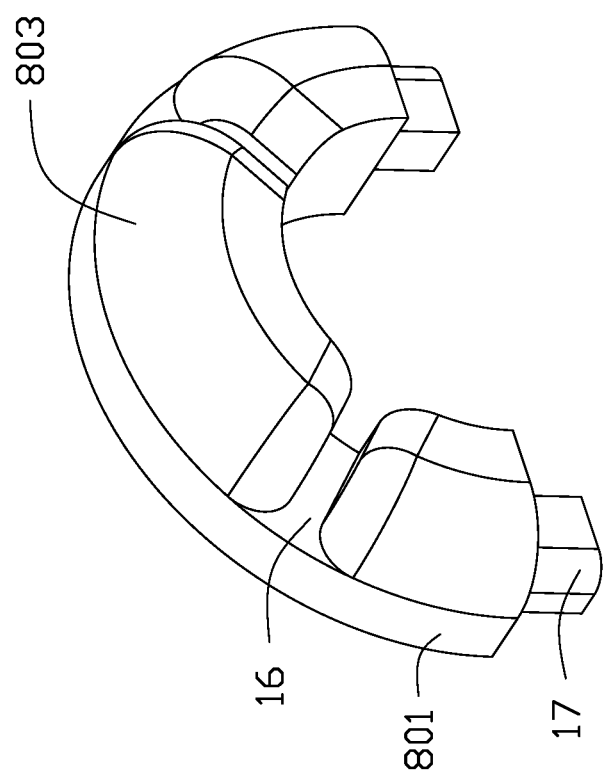
FIG. 8 is a structural schematic view of an upper part of the front guide ring according to an embodiment of the present disclosure.
Figure 9:
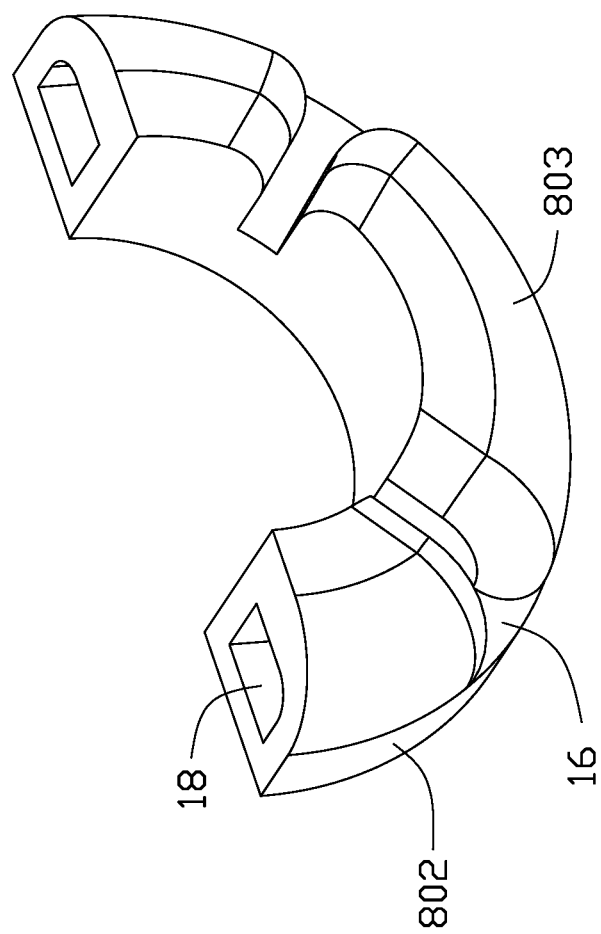
FIG. 9 is a structural schematic view of a lower part of the front guide ring according to an embodiment of the present disclosure.

As shown in FIG. 8 and FIG. 9, the front guide ring 8 includes an upper part 801 and a lower part 802. An end face of the upper part 801 is arranged with a block 17, and an end face of the lower part 802 defines a socket 18 for receiving the block 17. The block 17 may be engaged into the socket 18, such that the front guide ring 8 may be assembled or detached.

What is claimed is:

1. A plasma reactor that has an array of coaxial multiple pins, configured to process low temperature plasma, comprising: a rotating reactor, a fixed reactor, and a master tube;
   wherein an end of the master tube is connected to two branched tubes, an end of one of the two branched tubes is connected to the rotating reactor, and an end of the other one of the two branched tubes is connected to the fixed reactor;
   the master tube is arranged with a flow detector, and an electric three-way ball valve is arranged at connection between the master tube and the two branched tubes;
   when a flow rate of inlet gas entering the master tube is less than a preset threshold defined by the flow detector, all the inlet gas is capable of entering the rotating reactor from the branched tube connected to the rotating reactor and is capable of being processed by the rotating reactor;
   when the flow rate of the inlet gas entering the master tube is greater than the preset threshold of the flow detector, the electric three-way ball valve is configured to operate to allow a part of the inlet gas that exceeds the preset threshold to enter the fixed reactor from the branched tube connected to the fixed reactor and to be processed by the fixed reactor;
   a rotating blade is arranged on an inner electrode of the rotating reactor, when the flow rate of the inlet gas reaches a certain value, the inlet gas is configured to generate sufficient thrust on fan blades of the rotating blade to drive the rotating blade to rotate, a plurality of discharging pins arranged on a surface of the inner electrode of the rotating reactor are driven to rotate, a discharging treatment area of the discharging pins is expanded;
   an inner electrode of the fixed reactor is fixedly arranged, a front guide ring is arranged in front of a plurality of discharging pins of the inner electrode of the fixed reactor, the front guide ring radially defines a plurality of grooves, the plurality of grooves are aligned with the plurality of discharging pins.

2. The plasma reactor according to claim 1, wherein the rotating reactor comprises a first frame, a first flow guide cover is arranged on each of two sides of the first frame, a plurality of first reaction units are arranged inside the first frame;
   the first reaction unit comprises a first reaction tube, a first inner electrode is arranged inside the first reaction tube;
   the first inner electrode is arranged with a plurality of first discharging pins, the rotating blade is arranged on the first inner electrode;
   when the inlet gas passes through fan blades of the rotating blade, the inlet gas flows along surfaces of the fan blades of the rotating blade.

3. The plasma reactor according to claim 2, wherein the fixed reactor comprises a second frame, a baffle is arranged on each of two sides of the second frame and each of two sides of the first frame, the baffle is arranged with a low pressure connector, each of two sides of the second frame is arranged with a second flow guide cover;
   a plurality of second reaction units are arranged inside the second frame, each of the plurality of second reaction units comprises a second reaction tube connected to the second flow guide cover, a second inner electrode is arranged inside the second reaction tube;
   a surface of the second inner electrode is arranged with a plurality of second discharging pins, the front guide ring is arranged on the second inner electrode and is disposed at front of a corresponding one of the plurality of second discharging pins;
   a surface of the front guide ring is arranged with a convex surface, facing towards a gas inlet end of the fixed reactor;
   after the inlet gas enters the second reaction tube, the inlet gas contacts the convex surface of the front guide ring and flows into the plurality of grooves, the inlet gas spreads towards all directions along the plurality of grooves, and the inlet gas that flows along the plurality of grooves is concentrated and flows towards the corresponding second discharging pin.

4. The plasma reactor according to claim 3, wherein each of the first reaction tube and the second reaction tube comprises a quartz tube and a stainless steel mesh sleeved by the quartz tube;
   a part of the quartz tube and a corresponding part of the stainless steel mesh cooperatively form a high pressure pole area;
   a connection ring is arranged at a middle of the stainless steel mesh, and adjacent connection rings are connected to each other.

5. The plasma reactor according to claim 3, wherein the baffle is arranged with a plurality of end caps, each of the plurality of first reaction units and each of the plurality of second reaction units are disposed between two corresponding ones of the plurality of end caps;

each of the end caps defines a mounting slot, two ends of the second reaction tube extend into two corresponding mounting slots;

a sealing ring is received in the mounting slot;

each of the plurality of end caps defines a fixing hole to fix the second inner electrode and defines a through hole to intake or output the inlet gas.

6. The plasma reactor according to claim 3, wherein each of the first inner electrode and the second inner electrode is arranged with a plurality of fixing sleeves, and a set of first discharging pins and a set of second discharging pins are arranged on the fixing sleeves correspondingly.

7. The plasma reactor according to claim 2, wherein the first inner electrode is arranged with a flow guide ring, the flow guide ring is disposed at a front of a corresponding one of the plurality of first discharging pins;

a side of the flow guide ring facing the gas inlet end of the rotating reactor is arranged with a flow guide surface;

after the inlet gas contacts the flow guide ring, the inlet gas spreads outwards along the flow guide surface of the flow guide ring, a proportion of the inlet gas passing through tips of the first discharging pins is increased.

8. The plasma reactor according to claim 2, wherein the first inner electrode is arranged with a rear guide ring, the rear guide ring is disposed at a rear of a corresponding one of the plurality of first discharging pins, a surface of the rear guide ring is arranged with a concave surface, facing the gas inlet end of the rotating reactor;

after the inlet gas passes through the discharging area of the first discharging pins, the inlet gas contacts the rear guide ring and flows in return along the concave surface of the rear guide ring to form returning gas, the returning gas again passes through the discharging area of the first discharging pins and is again treated by the first discharging pins;

the returning gas and the inlet gas that flows forwardly form an axial vortex in the discharging area of the discharging pins, a time length that the gas stays in the discharging area of the first discharging pins is extended;

rotation of the first discharging pins drives the returning gas and the inlet gas and the high-energy electrons and ions to rotate to generate a radial airflow vortex, the radial airflow vortex is mixed with the axial vortex.

9. The plasma reactor according to claim 2, wherein each of the first inner electrode and the second inner electrode is arranged with a spoiled fan;

when the inlet gas passes through the spoiled fan, the inlet gas flows along fan blades of the spoiled fan, a flowing direction of the inlet gas is changed.

10. The plasma reactor according to claim 1, wherein the front guide ring comprises an upper part and a lower part, an end face of the upper part is arranged with a block, and an end face of the lower part defines a socket for receiving the block, and the block is capable of being engaged into the socket.

\* \* \* \* \*